United States Patent [19]
Nishi

[11] Patent Number: 5,003,342
[45] Date of Patent: Mar. 26, 1991

[54] EXPOSURE APPARATUS
[75] Inventor: Kenji Nishi, Kawasaki, Japan
[73] Assignee: Nikon Corporation, Tokyo, Japan
[21] Appl. No.: 361,507
[22] Filed: Jun. 5, 1989
[30] Foreign Application Priority Data Jun. 7, 1988 [JP] Japan .................. 63-140276

[51] Int. Cl.[5] .............. G03B 27/52; G03B 27/42
[52] U.S. Cl. .............................. 355/43; 355/53; 356/401
[58] Field of Search .................. 355/43, 45, 53; 356/400, 401

[56] References Cited
U.S. PATENT DOCUMENTS
4,875,076 10/1989 Torigoe et al. ................ 355/53
4,958,082 9/1990 Makinouchi et al. ......... 355/43 X FOREIGN PATENT DOCUMENTS
62-278402 12/1987 Japan.

Primary Examiner—L. T. Hix
Assistant Examiner—D. Rutledge
Attorney, Agent, or Firm—Shapiro and Shapiro

[57] ABSTRACT

An exposure apparatus for exposing a semiconductor wafer to a reticle pattern has a projection lens, a wafer stage arranged to travel two-dimensionally in the focal plane of the projection lens, a first position-detecting system whose Abbe error is approximately zero with respect to any exposure position, and a second position-detecting system whose Abbe error is approximately zero with respect to any alignment position. The exposure apparatus is also provided with an off-axis alignment system for detecting a fiducial mark on the wafer stage, an on-axis alignment system for detecting a reticle mark and the fiducial mark, and a main controller. The main controller utilizes the off-axis and on-axis alignment systems to detect the position of the fiducial marks, determines a correction constant, and controls the position of the wafer stage on the basis of the correction constant and a position signal corresponding to the wafer stage. In the case of exposure, the first position-detecting system is selected, while the second position-detecting system is selected with respect to alignment.

7 Claims, 6 Drawing Sheets

EXPOSURE APPARATUS

BACKGROUND OF THE INVENTION

1. Field of the Invention

The present invention relates generally to an exposure apparatus suitable for use in manufacturing semiconductor integrated circuits and, more particularly, to position control provided over a stage which carries a photosensitive substrate such as a semiconductor wafer.

2. Related Background Art

In the manufacture of semiconductor integrated circuits, an exposure apparatus of the reduced projection type utilizing a step-and-repeat system, that is, a stepper, is employed as the main device in a lithography step. The stepper includes an alignment apparatus which serves to position a projected image of a pattern formed on a mask or a reticle (hereinafter referred to simply as "reticle") in alignment with a circuit pattern (hereinafter referred to as "chip") formed on a photosensitive substrate (hereinafter referred to as "wafer"). Two major types of alignment apparatus are available; one type is called the on-axis alignment system and the other type the off-axis alignment system. In the on-axis alignment system, a mark on a reticle and a corresponding mark on a wafer are detected by means of a projection lens and the reticle so as to effect alignment, whereas, in the off-axis alignment system, only a mark on a wafer is detected for the purpose of effecting alignment; hence a mark on a reticle is not detected.

In a stepper of the type which utilizes the off-axis alignment system of these two major alignment systems, the mark-detecting reference position of the alignment system, i.e., an alignment position, differs from the projecting position at which an image of the circuit pattern of a reticle is to be projected, i.e., an exposure position. For this reason, conventional apparatus commonly have a construction such as that shown in FIG. 6. As illustrated, laser interferometers 106 and 109 for detecting the respective X- and Y-direction positions of a wafer stage 103 are disposed so that the optical axes of the laser beams generated by the respective laser interferometers 106 and 109 intersect each other at right angles in a common plane and so that the optical axis AX of a projection lens 100 passes through the intersection. Off-axis alignment systems 101 and 102 for optically detecting alignment marks or the like on a wafer W are disposed on the measurement axes of the respective laser interferometers 106 and 109 s that corresponding Abbe errors can be made approximately zero with respect to the alignment position and the exposure position. The laser interferometer 106 is arranged first to irradiate with a laser beam a movable mirror 104 provided on a wafer stage 103 and a fixed mirror 105 provided on the lens barrel of the projection lens 100 and then to photoelectrically detect interference fringes which are formed on the light receiving surface of a receiver by a reflected light beam. Similarly, the laser interferometer 109 is arranged first to irradiate with a laser beam a movable mirror 107 provided on the wafer stage 103 and a fixed mirror 108 provided on the lens barrel of the projection lens 100 and then to photoelectrically detect interference fringes which are formed on the light receiving surface of a receiver by a reflected light beam. In the stepper having the above-described construction and arrangement, alignment marks formed in association with a particular chip on the wafer W are detected by means of the respective alignment systems 101 and 102, and the X- and Y-direction alignment positions of the chip are read from the respective laser interferometers 106 and 109. Then, the wafer stage 103 is caused to travel by a predetermined amount on the basis of the alignment positions, that is, by an amount corresponding to a so-called base line which represents the relative positional relationship between the alignment position and the exposure position. The chip is moved to a location below the projection lens 100 so that, at this position, the projected image of the circuit pattern of the reticle and the chip are accurately super-imposed on each other for the purpose of exposure.

In an apparatus of the type shown in FIG. 6 in which the alignment systems 101 and 102 are disposed at locations offset from the measurement axes of the respective laser interferometers 106 and 109, these alignment systems 101 and 102 are used to detect alignment marks on the wafer W and the X- and Y-direction alignment positions of a particular chip are read from the respective laser interferometers 106 and 109. However, the measured value thus detected may include a measurement error due to the Abbe error. To cope with this measurement error, such an apparatus utilizes a differential interferometer 110 (FIG. 7) which is arranged to irradiate the movable mirror 104 with two divided laser beams, coaxially combine reflected light beams, receive the coaxially combined light beams by means of a receiver, photoelectrically detect interference fringes formed on the light receiving surface of the receiver, and detect the amount of rotation (the amount of yawing) of the wafer stage 103. On the basis of the obtained amount of rotation, the measured values of the respective laser interferometers 106 and 109 are corrected, and the wafer stage 103 is caused to travel on the basis of the corrected values. Subsequently, when the chip is to be moved to a location below the projection lens, positioning of the chip is carried out with the amount of rotation of the wafer stage 103 taken into account, whereby the projected image of the circuit pattern is accurately superimposed on the chip for exposure purposes.

However, steppers provided with off-axis alignment systems of the type described, such as the stepper shown in FIG. 6, involve the following problem. X- and Y-direction alignment marks must be independently detected by means of the alignment systems 101 and 102, so that it takes a substantial time to detect the positions of these alignment marks and also to measure a corresponding base line. As a result, the rate of throughput decreases. On the other hand, steppers of the type provided with the differential interferometer 110 shown in FIG. 7 involve the problem that, since the speed at which the differential interferometer 110 detects the amount of rotation of the wafer stage 103 is slower than the speed at which the wafer stage 103 fluctuates, it is impossible to accommodate fine variations in the position of the wafer stage 103. Moreover, the interval between the two divided laser beams with which the differential interferometer 110 irradiates the movable mirror 104 is restricted by the relationship between the stroke of the wafer stage 103 and the length of the movable mirror 104, with the result that the accuracy with which the differential interferometer 110 detects the amount of rotation of the wafer stage 103 cannot be improved beyond a certain limit.

SUMMARY OF THE INVENTION

It is, therefore, an object of the present invention to provide an exposure apparatus provided with a position detecting system which is capable of preventing any drop in the rate of throughput and any drop, due to Abbe errors, in the accuracy of position control over a wafer stage and of detecting the position of the wafer stage with improved accuracy and in a reduced time.

To achieve the above object, in accordance with the present invention, there is provided an apparatus arranged to project a pattern formed in the pattern region of a reticle onto a wafer through a projection lens, thereby exposing the wafer to an image of the pattern, which apparatus is provided with a wafer stage which carries the wafer while travelling two-dimensionally in the focal plane of the projection lens, a first position-detecting system arranged such that its Abbe error is approximately zero with respect to the position at which an image of the reticle pattern is projected by the projection lens, and a second position-detecting system arranged such that its Abbe error is approximately zero with respect to the mark-detecting reference position of the wafer alignment system. The exposure apparatus is also provided with an on-axis alignment system for detecting a reticle mark and a wafer mark or a fiducial mark formed on the wafer stage, in a common field of view and by means of the projection lens and the reticle, an off-axis wafer alignment system for optically detecting the wafer mark or the fiducial mark formed on the wafer stage, and a main controller. The main controller utilizes the off-axis and on-axis alignment systems to detect the position of corresponding fiducial marks, then determines, on the basis of the two results of position detection, the correction constant required to make the first position-detecting system correspond to the second position-detecting system, and then controls the position of the wafer stage on the basis of a position signal for the wafer stage which is supplied from at least one of the first position-detecting system and the second position-detecting system.

In accordance with the present invention, the correction constant is determined which serves to make the first position-detecting system correspond to the second position-detecting system, and, as required, the correction constant is reciprocally transferred between the first position-detecting system and the second position-detecting system. If exposure is to be effected, the first position-detecting system is selected which produces no Abbe error with respect to any exposure-position, while, if alignment or the like to be effected, the second position-detecting system is selected which produces no Abbe error with respect to any alignment position. Accordingly, it is possible to prevent any drop in the accuracy of position control of the wafer stage due to the Abbe error, any drop in the rate of throughput, and so forth, and it is also possible to effect exposure in a highly precise superimposed state.

Further objects, features and advantages of the present invention will become apparent from the following detailed description of an embodiment of the present invention with reference to the accompanying drawings.

BRIEF DESCRIPTION OF THE DRAWINGS

FIG. 3 is a schematic view which serves to illustrate operation of the embodiment during a base line measurement and the like;

DESCRIPTION OF THE PREFERRED EMBODIMENT

An embodiment of the present invention will be described below in detail with reference to the accompanying drawings.

Figure 1:
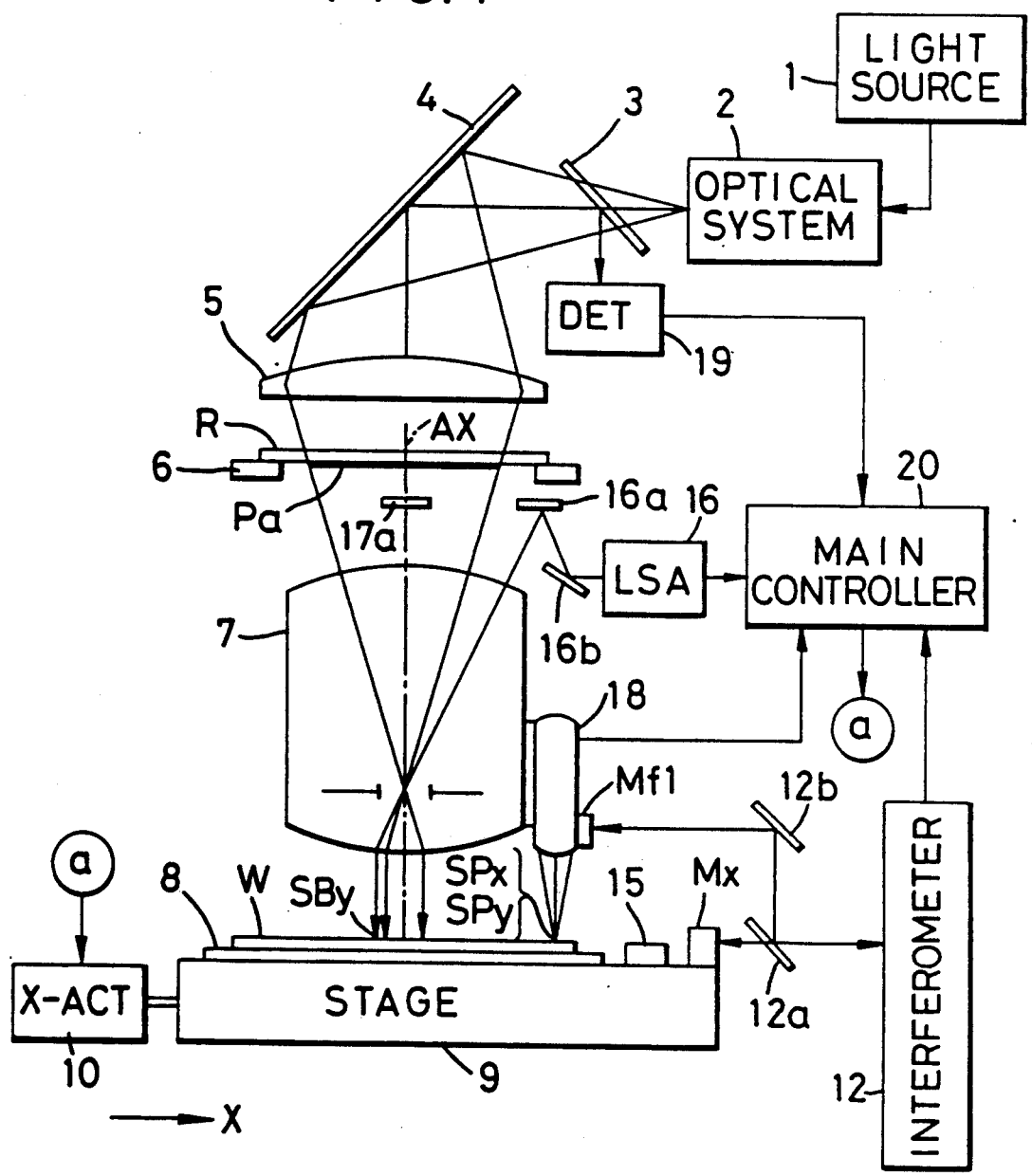
FIG. 1 is a view schematically showing the construction of a stepper according to one embodiment of the present invention.
Figure 2:
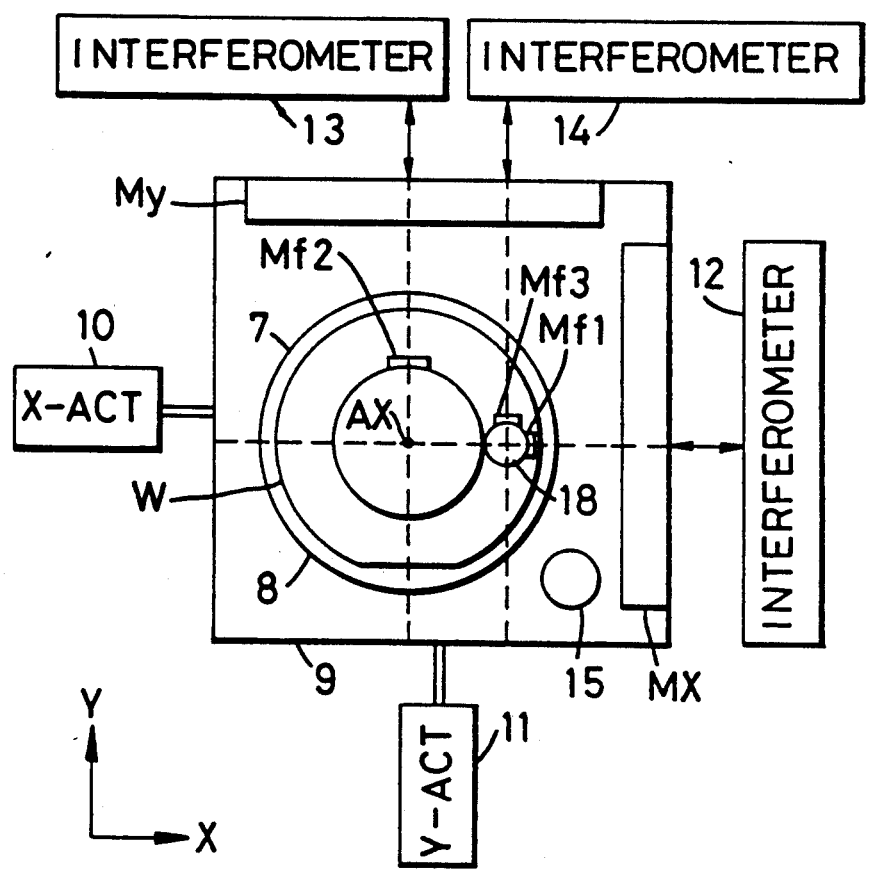
FIG. 2 is a plan view schematically showing the arrangement of two sets of position detecting systems for use in the stepper of FIG. 1.
Figure 3:
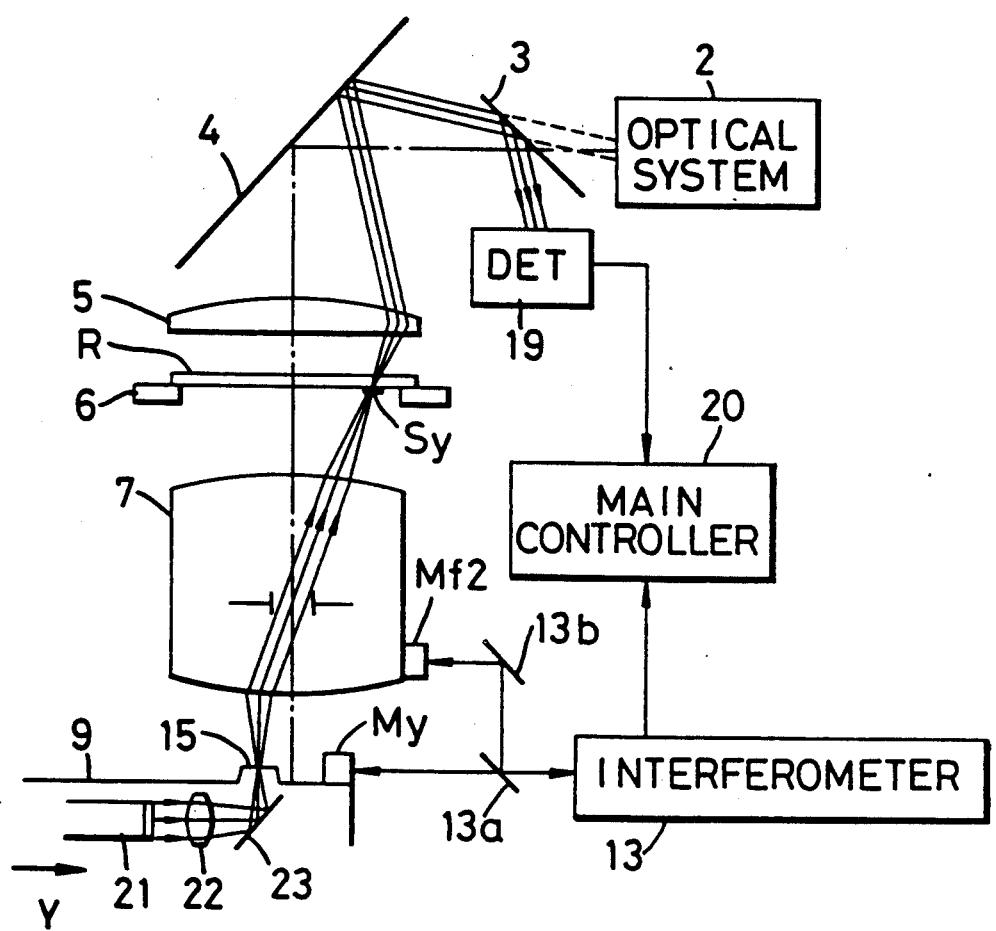

FIG. 1 is a diagrammatic view showing the construction of a stepper provided with two sets of position detecting systems in accordance with the embodiment of the present invention, FIG. 2 is a diagrammatic view showing the arrangement of the two sets of position detecting systems, and FIG. 3 is a schematic view which serves to illustrate the operation of the exposure apparatus during a base line measurement and so on.

Referring to FIG. 1, a light source 1 provided for exposure purposes generates illumination light, such as a g ray, an i ray or the like, of a wavelength (exposure wavelength) suitable for exposing resists. This illumination light is passed through an illumination optical system 2 which consists of a fly-eye lens or the like so as to make the illumination light uniform, and then through a beam splitter 3. The illumination light transmitted through the beam splitter 3 is reflected from a mirror 4 to a condenser lens 5, and the light converged by the condenser lens 5 illuminates, at uniform intensity, the overall pattern region Pa of a reticle R carried on a reticle stage 6. The reticle R has alignment marks (or rectangular transparent windows) Sx and Sy which extend in the X and Y directions in association with the pattern region Pa, respectively. A projection lens 7 having one or both sides telecentric projects an image of the circuit pattern formed in the pattern region Pa onto a resist-coated wafer W. The wafer W is attracted to a wafer holder ($\theta$ table) 8 by vacuum in such a manner that the wafer W is supported on a wafer stage 9 via the wafer holder 8. As shown in FIG. 2 as well, this wafer stage 9 is arranged to travel two-dimensionally in the focal plane of the projection lens 7 by means of a driving section (X-ACT) 10 and a driving section (Y-ACT) 11.

The position of the wafer stage 9 in the X direction is detected by a laser interferometer 12. This laser interferometer 12 is arranged to irradiate a movable mirror Mx disposed on the wafer stage 9 with one part of a laser beam through a beam splitter 12a and to irradiate a fixed mirror Mf1 with the other part of the laser beam via the beam splitter 12a and a reflection mirror 12b, the fixed mirror Mf1 being provided on the lens barrel of a wafer alignment system 18 which is integrally secured to the projection lens 7. The laser interferometer 12 is adapted to photoelectrically detect interference fringes which are formed on the light receiving surface of its receiver by reflected light beams. As shown in FIG. 2, the position of the wafer stage 9 in the Y direction is detected by a laser interferometer 13 which is arranged to irradiate, with laser beams, a movable mirror My provided on the wafer stage 9 and a fixed mirror Mf2 provided on the lens barrel of the projection lens 7 and to photoelectrically detect the interference fringes formed by reflected light beams. Similarly, a laser interferometer 14 is arranged first to irradiate, with laser beams, the movable mirror My provided on the wafer stage 9 and a fixed mirror Mf3 provided on the lens barrel of the wafer alignment system 18 and then to photoelectrically detect the interference fringes formed by reflected light beams. These laser interferometers 12, 13 and 14 are so arranged that the center axes (longitudinal measuring axes) of the respective laser beams emitted from the laser interferometers 12 and 13 intersect each other at right angles in a common plane with the optical axis AX of the projection lens 7 passing through the intersection point and that the center axes (longitudinal measuring axes) of the respective laser beams emitted from the laser interferometers 12 and 14 intersect each other at right angles in a common plane with the optical axis of the wafer alignment system 18 passing through the intersection point. A plane which includes these three longitudinal measuring axes (for example, the center axes of the respective laser beams) is located so as to approximately coincide with the focal plane of the projection lens 7.

In other words, the laser interferometers 12 and 13 are arranged so that their Abbe errors can be made approximately zero with respect to the exposure position, while the laser interferometers 12 and 14 are arranged so that their Abbe errors can be made approximately zero with respect to the alignment position.

A reference member 15 made of glass and provided with a reference mark (fiducial mark) FM is disposed on the wafer stage 9 in such a manner that the exposed upper surface of the reference member 15 is approximately flush with the surface of the wafer W which faces the projection lens 7. The fiducial mark FM of the reference member 15 consists of a combination of a cross pattern 15a which is a light-transmitting slit pattern and diffraction grating marks 15x and 15y which are so formed as to extend in the X and Y directions, respectively, and each of which is made from a light-reflecting chromium layer having an array of recesses. As shown in FIG. 3, the cross pattern 15a is designed to be illuminated from below (in the interior of the wafer stage 9) with exposure light which is transmitted through an optical fiber 21 to a location below the reference member 15. The light transmitted through this cross pattern 15a is passed through the projection lens 7 to form a projected image of the cross pattern 15a on the patterned surface of the reticle R. The light transmitted through the alignment mark Sx (or Sy) formed in the reticle R is conducted along the optical path formed by the condenser lens 5, the mirror 4 and the beam splitter 3 and is in turn received by a light-quantity detecting device 19 which has a light receiving surface at a location approximately conjugate with respect to the pupil of the projection lens 7.

The on-axis alignment system shown in FIG. 1, that is to say, a laser step alignment system (LSA system) 16, is arranged to conduct a laser beam along the optical path formed by mirrors 16b and 16a and the projection lens 7 and irradiate, with a beam spot SBy in a sheet-like form, either an alignment mark (or diffraction grating mark) formed in association with each chip on the wafer W or the diffraction grating mark 15y formed on the reference member 15. This is beam spot SBy is formed so as to extend in the X direction within the exposure field of the projection lens 7 and toward the optical axis AX of the projection lens 7. Light diffracted (or scattered) by the alignment mark is received for photo-electric detection, and the photo-electric signal thus obtained is sampled in synchronization with position signals generated by the laser interferometer 13. Thus, the positions of the alignment mark and the beam spot SBy in the Y direction are detected on the basis of the results obtained by carrying out arithmetic operations on the sampled signals. The LSA system 16 is provided for detecting the Y-direction position alone and, in practice, an LSA system 17 for detecting the X-direction position is also provided, although only a mirror 17a in the LSA system 17 is shown in FIG. 1.

The off-axis wafer alignment system 18 is arranged to appropriately switch beam spots SPx and SPy which respectively extend in the Y and X directions and irradiate, with the beam spot SPx or SPy, a particular alignment mark on the wafer W, the diffraction grating mark 15x or 15y, or other elements. While the wafer stage 9 is being finely moved, light diffracted (scattered) from the beam spot SPx or SPy through the diffraction grating mark 15x or 15y is received for photoelectric conversion, thereby detecting the X- and Y-direction positions of a particular chip on the wafer W or those of the respective beam spots SPx and SPy formed by the wafer alignment system 18.

The wafer alignment system 18 may be of a type which differs from the above-described one. For example, as disclosed in Japanese Pat. Laid-Open No. 62-278402 filed by the present applicant, the wafer alignment system 18 may be of the type in which an alignment mark or the like on the wafer W is observed on an enlarged scale to process an image signal provided by an image sensor such as an ITV.

The wafer alignment system 18 is mechanically fixed at a location where its optical axis is spaced a constant distance apart from the optical axis of the projection lens 7, and the wafer alignment system 18 and the projection lens 7 are connected by a member which almost never expands or contracts with temperature changes.

A main controller 20 provides two-dimensional position control over the wafer stage 9 on the basis of a position signal supplied from at least one of the combination of the laser interferometers 12 and 13 and the combination of the laser interferometers 12 and 14, and also provides global control over the operation of the overall apparatus including the aforesaid two alignment systems, the light-quantity detecting device 19 and so forth.

Figure 4A:
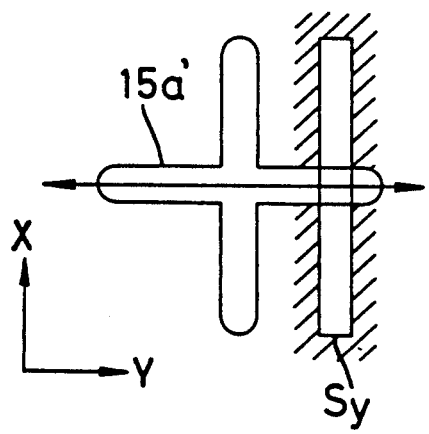
FIG. 4A is a view showing the relationship between a projected image of a cross pattern and the alignment mark of a reticle in the embodiment.

The operation of the apparatus according to the embodiment will be explained below. Referring to FIGS. 1. 2 and 3, the main controller 20 detects the Y-direction position of the alignment mark Sy of the reticle R and the Y-direction position of the beam spot SPx on the wafer alignment system 18 and measure the Y-direction base line of the wafer alignment system 18. As shown in FIG. 3, exposure light which is transmitted through the optical fiber 21 to a location below the reference member 15 is employed to illuminate the reference member 15 from below by means of a lens 21 and a mirror 22, and a projected image 15a' of the cross pattern 15a such as that shown in FIG. 4A is formed on the patterned surface of the reticle R by means of the projection lens 7. In this state, the wafer stage 9 is caused to finely travel in the Y direction so that the projected image 15a' relatively scans the alignment mark Sy in the Y direction. Light transmitted through the alignment mark Sy is conducted along the optical path formed by the condenser lens 5, the mirror 4, and the beam splitter 3, and is then received by the light-quantity detecting device 19. During this reception, when the projected image 15a' coincides with the alignment mark Sy, the maximum quantity of light passes therethrough, and as the discrepancy therebetween increases, the quantity of light passing therethrough decreases. Light transmitted through the alignment mark Sy is in turn photoelectrically converted by the light-quantity detecting device 19. The thus-obtained photo-electric output S1 is shown in FIG. 4B.

Figure 4B:
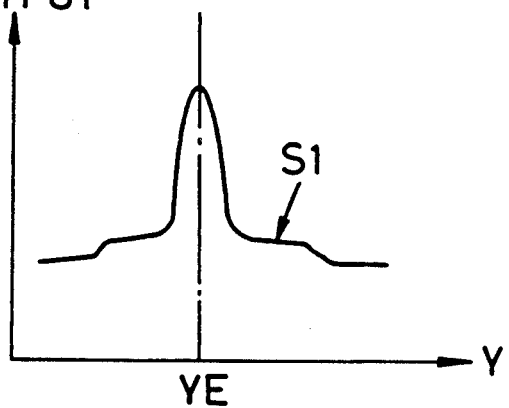
FIG. 4B is a graphic representation showing the waveform of a photo-electric output obtained in the relationship of FIG. 4A.

In FIG. 4B, the position at which the photoelectric output S1 reaches its peak level corresponds to the position at which the projected image 15a' coincides with the alignment mark Sy, that is, the Y-direction position of the alignment mark Sy. The main controller 20 detects the Y-direction position of the alignment mark Sy on the basis of the photoelectric signal S1 which is sampled in synchronization with a position signal supplied from the laser interferometer 13, and stores the resultant value as a Y-coordinate value YE.

Figure 5A:
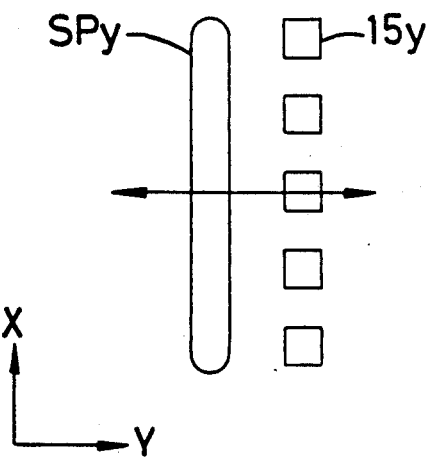
FIG. 5A is a view showing the relationship between a beam spot and a diffraction grating mark in the embodiment.

Then, after the main controller 20 has appropriately switched the beam spot SPx and SPy of the wafer alignment system 18, the main controller 20 causes the beam spot SPy to illuminate the diffraction grating mark 15y which is located in primary relationship with the cross pattern 15a on the reference member 15. In this state, the wafer stage 9 is caused to finely travel in the Y direction so that, as shown in FIG. 5A, the beam spot Spy relatively scans the diffraction grating mark 15y in the Y direction. Then, light diffracted by the diffraction grating mark 15y is received by a photo-electric detector (not shown) which constitutes part of the wafer alignment system 18, and the diffracted light is photoelectrically converted by the photo-electric detector The thus-obtained photo-electric output S2 is shown in FIG. 5B.

Figure 5B:
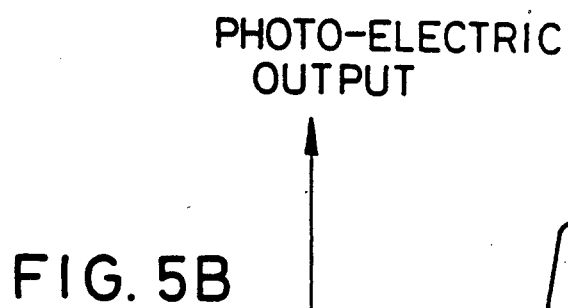
FIG. 5B is a graphic representation showing the waveform of a photo-electric output obtained in the relationship of FIG. 5A.
Figure 6:
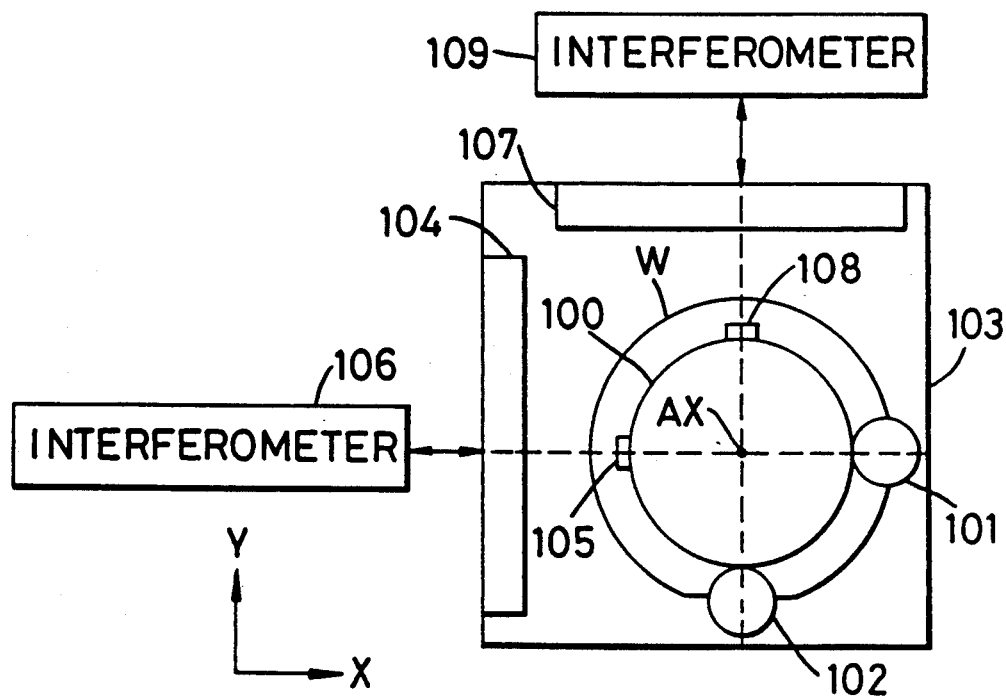
FIGS. 6 and 7 are schematic plan views which serve to illustrate a conventional apparatus.
Figure 7:
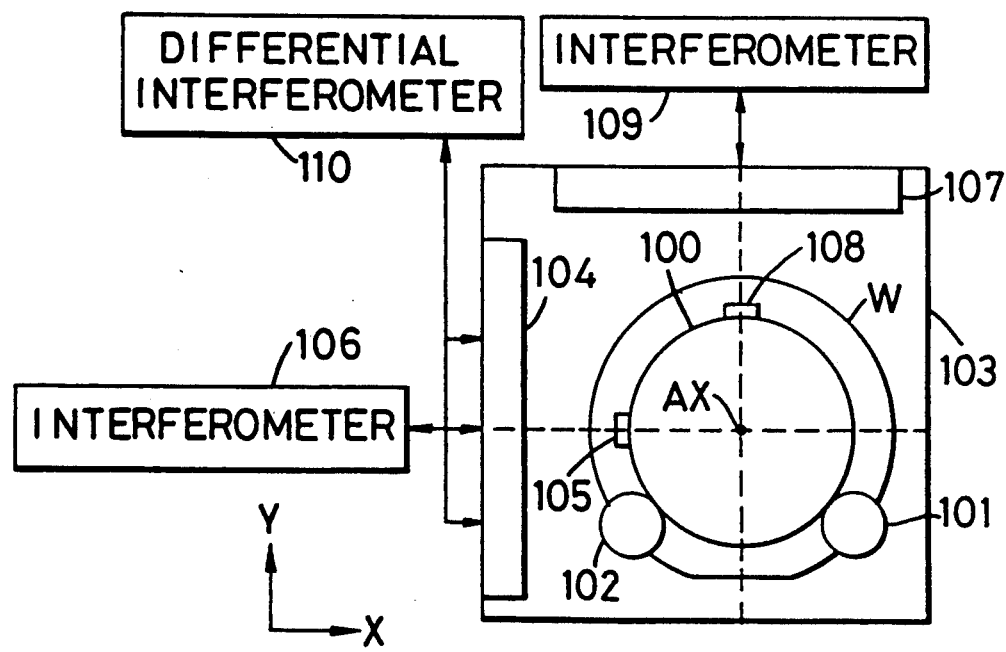

In FIG. 5B, the position at which the photo-electric output S2 reaches its peak level corresponds to the Y-direction position of the beam spot. The main controller 20 detects the Y-direction position of the beam spot SPy on the basis of a photo-electric signal S2 sampled in synchronization with a position signal supplied from the laser interferometer 14, and stores the resultant value as a Y-coordinate value YA. The main controller 20 obtains by calculation the Y-direction base line of the wafer alignment system 18 on the basis of the two Y-coordinate values YE and YA and the design interval between the cross pattern 15a and the diffraction grating mark 15y on the reference member 15, and stores the resultant value as a base line $\Delta Yb$. Simultaneously, the main controller 20 employs the diffraction grating mark 15x on the reference member 15 to detect the X-direction position of the alignment mark Sx of the reticle R and the X-direction position of the beam spot SPx of the wafer alignment system 18 by an operation similar to the above-described one. The main controller 20 obtains by calculation the X-direction base line of the wafer alignment system 18 on the basis of the two X-coordinate values XE and XA and the design interval between the cross pattern 15a and the diffraction grating mark 15x on the reference member 15, and stores the resultant value as a base line $\Delta Xb$.

In a general construction, counters (not shown) are provided for reversibly counting the up/down pulses output from the respective laser interferometers 12, 13 and 14, and the count values of the respective counters are reset to predetermined values, for example, zero when the stepper is initialized. However, the inclination of the wafer stage 9 may vary by a slight angle during each stepping operation due to a manufacturing error or a mounting error in the movable mirror Mx or My, the yawing of the wafer stage 9, or the like. If it is assumed that the count value of each of the counters is reset to zero with the wafer stage 9 being inclined by an amount of, for example, $\Delta\theta 1$ with respect to the X axis of the X-Y coordinates, a measurement error corresponding to the inclination of $\Delta\theta 1$ occurs between the measurement results of the laser interferometers 13 and 14. Then, alignment of a chip C on the wafer W is performed by using the wafer alignment system 18 and the laser interferometers 12 and 13 with the wafer stage 9 being inclined by $\Delta\theta 2$ with respect to the X axis of the X-Y coordinates. Thereafter, as the position of the wafer stage 9 which has been inclined by $\Delta\theta 3$ with respect to the X axis due to yawing is being monitored by means of the laser interferometers 12 and 13, the chip C is located at an exposure position on the basis of the measured values detected by the laser interferometers 12 and 14. In such a case, however, since the zero-resetting of the counters is effected on the basis of the measurement error occurring between the measured values detected by the laser interferometers 13 and 14, the chip C may be located at a position which deviates from the exposure position by means of the laser interferometers 12 and 13, thus resulting in a drop in the accuracy of position control of the wafer stage 9. For this reason, the main controller 20 is arranged t detect the Y-direction measurement error occurring between the Y-direction measured values detected by the laser interferometers 13 and 14 due to yawing in the zero-resetting of the counters, manufacturing errors, or the like, and stores the Y-direction measurement error as a correction constant $\Delta Y$ which serves to make the measured value of the laser interferometer 13 correspond to that of the laser interferometer 14. To obtain the correction constant $\Delta Y$, the main controller 20 first causes the LSA system 16 to irradiate with the beam spot SBy the diffraction grating mark 15y on the reference member 15. The beam spot SBy from the LSA system 16 is formed such that its optical axis deviates from the measurement axis of the laser interferometer 13, so that the Abbe error does not approach approximately zero. However, since the amount by which the beam spot SBy deviates from the measurement axis is small, the measurement error derived from the diffraction grating mark 15y due to the Abbe error may be ignored in practice. Then, the wafer stage 9 is caused to finely travel in the Y direction in a manner similar to that used in detecting the diffraction grating mark 15y for the purposes of the base line measurement described above, that is to say, the wafer stage 9 is caused to finely travel in the Y direction so as to make the beam spot SBy relatively scan the diffraction grating mark 15y in the Y direction. On the basis of a photo-electric signal obtained by photoelectric conversion of the resultant diffracted light and a position signal supplied from the laser interferometer 13, the main controller 20 detects the Y-direction position of the diffraction grating mark 15y and stores the detection value as a Y-coordinate value YL. Then, the main controller 20 utilizes the beam spot SPy emitted from the wafer alignment system 18 to detect the Y-direction position of the diffraction grating mark 15y, but this Y-direction position is already detected as the Y-coordinate value YA during the aforesaid base line measurement in the Y-direction. In the following operation, therefore, the Y-coordinate value YA is employed as the Y-direction position of the diffraction grating mark 15y. Then, on the basis of the two Y-coordinate values YL and YA, the main controller 20 calculates what measurement error would occur between the measured values detected by the respective laser interferometers 13 and 14 owing to yawing or the like during the operation of resetting the respective counters to zeros, and stores the thus-obtained value as the correction constant $\Delta Y$ (for example, $\Delta Y = YA - YL$).

In the above-described manner, the measurement of the base lines ($\Delta Xb$, $\Delta Yb$) and the correction constant $\Delta Y$ which serves to make the measured value of the laser interferometer 13 correspond to that of the laser interferometer 14 is completed. Then, a projected image of the circuit pattern of the reticle R is superimposed on a particular chip disposed on the wafer W and the step of exposure is carried out. Initially, the main controller 20 utilizes the wafer alignment system 18 to effect alignment of the first chip on the wafer W. Subsequently, the main controller 20 causes the wafer stage 9 to step by an amount equivalent to each of the base lines ($\Delta Xb$, $\Delta Yb$) and locates the first chip at the exposure position while monitoring the position of the wafer stage 9 by means of the laser interferometers 12 and 13. In the Y-direction positioning during the positioning operation described above, the main controller 20 causes the wafer stage 9 to travel by the amount equivalent to the base line $\Delta Yb$ while taking account of the correction constant $\Delta Y$ in order to locate the first chip at the exposure position. In other words, if the alignment position of this chip in the Y direction is assumed to be a Y-coordinate value Ya, the wafer stage 9 is positioned so that the laser interferometer 13 can detect a value Ye ($Ye = Ya + \Delta Yb + \Delta Y$). In this manner, the wafer stage 9 is positioned without any drop in the accuracy of position detection of each of the laser interferometers 12, 13 and 14 due to the Abbe error. Thereafter, by sequentially stepping the wafer stage 9 by a predetermined amount, the projected image of the circuit pattern of the reticle R can be made to coincide with the desired chip on the wafer W so that exposure is enabled in a highly precise superimposed state.

It is to be noted that, although in the embodiment of the present invention the laser interferometer 12 for detecting the X-direction position is disposed so that the Abbe errors relative to the alignment position and the exposure position can approach approximately zero, the present invention is not limited to such an arrangement. For example, two sets of laser interferometers for detecting the X-direction position may be independently disposed so that, if the wafer alignment system 18 does not satisfy the Abbe conditions in the X and Y directions, the respective Abbe errors can reach approximately zero with respect to the alignment position and the exposure position.

In the embodiment described above, the correction constant $\Delta Y$ is detected by means of the LSA system 16 and the wafer alignment system 18, and positioning of the wafer stage 9 is executed on the basis of the correction constant $\Delta Y$ and the base line $\Delta Yb$. However, with the following method, it will become unnecessary to take into account the correction constant $\Delta Y$ while moving the position of the wafer stage 9, as in the above embodiment. In this method, first of all, the diffraction grating mark 15ȳ on the reference member 15 is detected by means of the LSA system 16, and the wafer stage 9 is stopped at the position at which the beam spot SBy coincides with the diffraction grating mark 15y. At this position, the counter for reversibly counting the up/down pulses output from the laser interferometer 13 is reset to zero. Then, the diffraction grating mark 15y is detected by means of the wafer alignment system 18, and the counter associated with the laser interferometer 14 is reset to zero at the position at which the beam spot SPy coincides with the diffraction grating mark 15y. In this manner, the difference between the measured values of the laser interferometers 13 and 14 is made zero and it is therefore unnecessary to move the position of the wafer stage 9 while taking into account the correction $\Delta Y$ as in the above-described embodiment. In other words, if the wafer stage 9 is positioned in such a way that the laser interferometer 13 detects the same value as the measured value detected by the laser interferometer 14, it is possible to prevent any drop in the accuracy with which position control of the wafer stage 9 is effected due to the difference between the measured values detected by the laser interferometers 13 and 14, and it is also possible to easily execute position control over the wafer state 9.

In the embodiment described above, in order to bring about the correspondence between the laser interferometers 13 and 14, the LSA system 16 and the wafer alignment system 18 are employed to detect the diffraction grating mark 15y, thereby providing the correction constant $\Delta Y$, or, alternatively, the laser interferometers 13 and 14 are reset to zero at the position at which the diffraction grating mark 15y is detected. However, in order to achieve a similar advantage, the cross pattern 15a on the reference member 15 and the light-quantity detecting device 19 may be employed in place of the LSA system 16 so as to detect the alignment mark Sy of the reticle R, which is set at a predetermined position on the reticle stage 6, by an operation similar to that used in the base line measurement. The correction constant $\Delta Y$ may be calculated by using the resultant Y coordinate value, or the laser interferometers 13 and 14 may be reset to zero. In this manner, it is possible to achieve benefits similar to those of the embodiment described above without the special need to use the LSA system 16.

While the present invention has been described with respect to what is presently considered to be the preferred embodiment, it is to be understood that the invention is not limited to the disclosed embodiment. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus, comprising:
   a projecting optical system for projecting an image of a pattern disposed in a first plane onto a second plane;

stage means arranged to travel two-dimensionally along said second plane;

first position-detecting means having a detection axis parallel to said second plane for detecting the position of said stage means, said first position-detecting means being arranged such that the Abbe error thereof within a plane parallel to said second plane is approximately zero with respect to a position at which an image of said pattern is to be projected by said projecting optical system;

pattern detecting means having a detection center at a location spaced apart from said position at which said image of said pattern is to be projected, by a predetermined distance in a direction parallel to said second plane; and second position-detecting means having a detection axis substantially parallel to the detection axis of said first position-detecting means for detecting the position of said stage means, said second position-detecting means being arranged such that the Abbe error thereof within a plane parallel to said second plane is approximately zero with respect to the detection center of said pattern detecting means.

2. An exposure apparatus according to claim 1, wherein said pattern detecting means includes an alignment optical system having an optical axis which passes through said detection center.

3. An exposure apparatus according to claim 2, wherein the detection axis of said first position-detecting means intersects the optical axis of said projecting optical system, and the detection axis of said second position-detecting means intersects the detection center of said pattern detecting means.

4. An exposure apparatus according to claim 3, wherein said detection axis of said first position-detecting means is spaced apart from said detection axis of said second position-detecting means by a distance corresponding to said predetermined distance.

5. An exposure apparatus according to claim 2, wherein said first position-detecting means detects the relative position between said projecting optical system and said stage means, said second position-detecting means detecting the relative position between said alignment optical system and said stage means.

6. An exposure apparatus, comprising:

a projecting optical system for projecting an image of a pattern disposed in a first plane onto an object disposed in a second plane;

stage means supporting said object thereon and arranged to travel two-dimensionally along said second plane;

first position-detecting means having a detection axis parallel to said second plane for detecting the position of said stage means, said first position-detecting means being arranged such that the Abbe error thereof within a plane parallel to said second plane is approximately zero with respect to a position at which an image of said pattern is to be projected by said projecting optical system;

pattern detecting means having a detection center at a location spaced apart from said position at which said image of said pattern is to be projected, by a predetermined distance in a direction parallel to said second plane;

second position-detecting means having a detection axis substantially parallel to the detection axis of said first position-detecting means for detecting the position of said stage means, said second position-detecting means being arranged such that the Abbe error thereof within a plane parallel to said second plane is approximately zero with respect to the detection center of said pattern detecting means;

means for supplying a correction value corresponding to the difference between measured values of said first and second position-detecting means;

means for determining a position of said object in response to said pattern detecting means and said second position-detecting means; and control means for controlling said stage means on the basis of the determined position of said object and said first position-detecting means and for moving said object to said position at which said image of said pattern is to be projected.

7. An exposure apparatus according to claim 6, wherein said correction value shows the difference between positions of said stage means corresponding to the distance between said detection axis of said first position-detecting means and said detection axis of said second position-detecting means.

* * * * *